(12) United States Patent
Lunz et al.

(10) Patent No.: US 10,088,114 B2
(45) Date of Patent: Oct. 2, 2018

(54) PLASMONIC WHITE LIGHT SOURCE BASED ON FRET COUPLED EMITTERS

(71) Applicant: PHILIPS LIGHTING HOLDING B.V., Eindhoven (NL)

(72) Inventors: Manuela Lunz, Eindhoven (NL); Marcus Antonius Verschuuren, Eindhoven (NL); Gabriel Lozano, Eindhoven (NL); Ke Guo, Eindhoven (NL); Dirk Kornelis Gerhardus De Boer, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/601,257

(22) Filed: May 22, 2017

(65) Prior Publication Data
US 2017/0350563 A1    Dec. 7, 2017

(30) Foreign Application Priority Data

Jun. 2, 2016   (EP) .................................... 16172599

(51) Int. Cl.
*F21K 9/64*    (2016.01)
*F21V 9/16*    (2006.01)
(Continued)

(52) U.S. Cl.
CPC ............ *F21K 9/64* (2016.08); *C09K 11/0883* (2013.01); *F21V 9/16* (2013.01); *F21V 9/30* (2018.02);
(Continued)

(58) Field of Classification Search
CPC ..... F21K 9/64; F21K 9/50; F21K 9/56; F21V 9/30; F21V 9/16; G02B 5/008;
(Continued)

(56) References Cited

U.S. PATENT DOCUMENTS

| 9,647,182 B2 * | 5/2017 | Verschuuren | ......... H01L 33/508 |
| 2008/0042563 A1 * | 2/2008 | Niigaki | ................... H01J 31/48 |
| | | | 313/542 |

(Continued)

FOREIGN PATENT DOCUMENTS

WO    WO2015019220 A1    2/2015
WO    WO2015180976 A1    12/2015

OTHER PUBLICATIONS

M. Lunz, et al., "Modification of the FRET Rate in Quantum Dot Structures", Transparent Optical Networks (ICTON), 2011 13th International Conference on, IEEE, Jun. 26, 2011, pp. 1-4.

(Continued)

*Primary Examiner* — Joseph L Williams
*Assistant Examiner* — Jose M Diaz
(74) *Attorney, Agent, or Firm* — Akarsh P. Belagodu (57) ABSTRACT

The invention provides a lighting device comprising a light source and a light converter, wherein the light source is configured to provide light source light, wherein the light converter comprises a donor luminescent material able to convert at least part of the first light source light into donor light, and a acceptor luminescent material, wherein the donor luminescent material and acceptor luminescent material are configured as donor-acceptor luminescent materials which, upon excitation of the donor luminescent material by the light source light provide acceptor light having an acceptor light spectral distribution different from a donor light spectral distribution of the donor light, wherein the light converter further comprises a periodic plasmonic antenna array configured to enhance generation of said donor light, and wherein the lighting device is configured to provide lighting device light comprising said donor light and said acceptor light.

14 Claims, 6 Drawing Sheets

(51) Int. Cl.
    G02B 5/00      (2006.01)
    H01L 33/50     (2010.01)
    C09K 11/08     (2006.01)
    H01L 33/58     (2010.01)
    F21V 9/30      (2018.01)
(52) U.S. Cl.
    CPC ............ G02B 5/008 (2013.01); H01L 33/502 (2013.01); H01L 33/58 (2013.01)
(58) Field of Classification Search
    CPC ... H01L 33/502; H01L 33/50; C09K 11/0883; G02F 2001/133614; G03B 21/204
    See application file for complete search history.

(56) References Cited

U.S. PATENT DOCUMENTS

| | | | | |
|---|---|---|---|---|
| 2008/0315235 | A1* | 12/2008 | Murazaki | C09K 11/0883 257/98 |
| 2010/0126566 | A1* | 5/2010 | Ji | G02B 5/008 136/252 |
| 2010/0213489 | A1* | 8/2010 | Kim | C09K 11/65 257/98 |
| 2013/0119280 | A1* | 5/2013 | Fuchi | F21V 9/30 250/504 R |
| 2014/0264412 | A1* | 9/2014 | Yoon | H01L 33/504 257/98 |
| 2016/0010813 | A1 | 1/2016 | Rodriguez et al. | |
| 2016/0161644 | A1* | 6/2016 | Verschuuren | H01L 33/508 250/396 R |
| 2016/0190403 | A1* | 6/2016 | Verschuuren | H01L 33/504 257/98 |
| 2017/0082785 | A1* | 3/2017 | Verschuuren | H01L 33/507 |
| 2017/0089546 | A1* | 3/2017 | Verschuuren | H01L 33/502 |
| 2017/0271562 | A1* | 9/2017 | Wang | H01L 33/60 |
| 2017/0309797 | A1* | 10/2017 | De Boer | H01L 33/507 |
| 2018/0097570 | A1* | 4/2018 | Naughton | H04B 10/70 |

OTHER PUBLICATIONS

V. Giannini, et al., "Lighting Up Multipolar Surface Plasmon Polaritons by Collective Resonances in Arrays of Nanoantennas", Physical Review Letters, vol. 105, No. 26, Dec. 20, 2010, pp. 266801-1 through 266801-4.

P. Andrew, et al., "Forster Energy Transfer in an Optical Microcavity", downloaded from www.sciencemag.org, Dec. 4, 2015, pp. 785-789.

C. Blum, et al., "Nanophotonic Control of the Forster Resonance Energy Transfer Efficiency", American Physical Society, vol. 109, No. 20, Nov. 16, 2012, pp. 203601-1 through 203601-5.

A. Govorov, et al., Theory of Plasmon-Enhanced Forster Energy Transfer in Optically Excited Semiconductor and Metal Nanoparticles, Physical Review B 76, 125308 (2007), pp. 125308-1 through 125308-16.

* cited by examiner

FIG. 7

PLASMONIC WHITE LIGHT SOURCE BASED ON FRET COUPLED EMITTERS

FIELD OF THE INVENTION

The invention relates to a lighting device comprising a light source and a light converter.

BACKGROUND OF THE INVENTION

Solid state illumination devices based on non-radiative energy transfer are known in the art. WO2015180976, for instance, describes an illumination device comprising: a wavelength converting layer comprising a photon emitting donor configured to absorb energy to reach an excited state, and a photon emitting acceptor, an energy source configured to provide energy to the donor such that the donor reach the excited state; wherein the donor and the acceptor are selected and arranged at a distance from each other such that non-radiative transfer of excitation energy from the donor to the acceptor occur, and wherein the acceptor is configured to emit a photon at a second wavelength after the transfer of energy; the illumination device further comprising a periodic plasmonic antenna array, arranged on the substrate and embedded within the wavelength converting layer, and comprising a plurality of individual antenna elements arranged in an antenna array plane, the plasmonic antenna array being configured to support a first lattice resonance at the second wavelength, arising from coupling of localized surface plasmon resonances in the individual antenna elements to photonic modes supported by the system comprising the plasmonic antenna array and the wavelength converting layer, wherein the plasmonic antenna array is configured to comprise plasmon resonance modes such that light emitted from the plasmonic antenna array has an anisotropic angle distribution.

SUMMARY OF THE INVENTION

Plasmonic enhancement via surface lattice resonances appears to provide promising results for single color application, especially for red emissions as there the secondary effect of spectral shaping can help enhance the lumen equivalent by mostly enhancing light that lies within the range of the human eye sensitivity. However, it is considered difficult to make a single white-light emitting plasmonic LED device.

It appears to be possible to use Förster resonance energy transfer (FRET) from a donor ("donor luminescent material") to an acceptor ("acceptor luminescent material") to generate white light. This can for example help to overcome an intrinsic or concentration dependent absorption limit of the acceptor at the excitation wavelength or by-pass radiative energy transfer (re-absorption) in case the emission process of the donor has a low efficiency. However, using only a FRET coupled donor-acceptor system to generate white light, e.g. with a green emitting donor and a red emitting acceptor, is very difficult. The FRET efficiency and hence the donor emission quenching depends strongly on the acceptor concentration. To obtain white light, a significant part of the donor excitation has to decay into radiative emission of the donor, i.e. the system has to be designed to operate at a FRET efficiency of 30-60%. First of all, this may only lead to a minor enhancement of the acceptor emission. Secondly, this requires very high control of the concentrations applied, as small changes in concentration can lead to large changes in FRET efficiency and hence donor quenching. This in turn will affect the ratio between donor and acceptor emission and therefore the color point i.e. the perceived color of the light.

Hence, it is an aspect of the invention to provide an alternative lighting device, which preferably further at least partly obviates one or more of above-described drawbacks, and which in embodiments may provide white light, or in other embodiments may provide colored light in a plurality of wavelength regions, in a relative efficient way.

Herein, a combination of at least two different light conversion phosphors coupled by Forster resonant energy transfer (FRET) and a plasmonic (metal) nanoparticle array to generate enhanced white light is proposed. The plasmonic nanoparticle array is at least in resonance with the donor emission, i.e. enhancing and shaping the light emitted by the donor, but can also be—in embodiments—in resonance with the acceptor emission. The latter can be achieved by specifically designing the plasmonic array or by combining two different arrays (i.e. geometries or particle shapes) that can both interact with the donor-acceptor system.

As solution for a much better controllable system, it is proposed to design the system at higher acceptor concentrations to achieve at least 70%, even more especially at least 80% FRET efficiency, or even more, where the influence of the concentration on quenching and enhancement is low, and use the plasmonic array to couple out the donor emission that is needed to achieve a certain color point and/or spectral distribution. In this way the system is more robust against concentration variations and can be tuned by changes in the plasmonic array, i.e. geometrical parameters and material used during production of the device.

Hence, the invention provides a lighting device ("device") comprising a light source and a light converter ("converter"), wherein the light source is configured to provide light source light, wherein the light converter comprises (a) a donor luminescent material ("donor") able to convert at least part of the first light source light into donor light, and (b) an acceptor luminescent material ("acceptor"), wherein the donor luminescent material and acceptor luminescent material are configured as donor-acceptor luminescent materials which, upon excitation of the donor luminescent material by the light source light provide acceptor light having an acceptor light spectral distribution different from a donor light spectral distribution of the donor light, wherein the light converter further comprises (c) a periodic plasmonic antenna array ("annenta array" or "plasmonic antenna array") configured to enhance generation of said donor light (and/or configured to control directionality of said donor light), and wherein the lighting device is configured to provide lighting device light comprising said donor light and said acceptor light.

With such lighting device, the benefits from FRET are coupled with an enhancement of the donor emission, thereby providing lighting device light including at least donor light and acceptor light. Without the periodic plasmonic antenna array, substantially only acceptor light may be obtained at high FRET efficiencies. Now, with the present invention the high FRET efficiencies maybe maintained, but the donor emission (is) also enhanced with the periodic plasmonic antenna array. Therefore, the lighting device light will at least include two emissions at different wavelengths, such as at least two emission bands (due to donor emmission and acceptor emission). Further, as also light source light may be part of the lighting device light, the lighting device may—in embodiments—be able to provide e.g. white light.

Hence, in embodiments the donor luminescent material, acceptor luminescent material, and the periodic plasmonic antenna array are configured to provide, upon generation of the light source light, said lighting device light comprising said donor light, said acceptor light, and (optionally) said light source light. Yet further, in embodiments, the lighting device is configured to generate white lighting device light.

In the invention, a wavelength converter or light converter is provided, which comprises a donor and an acceptor where non-radiative energy transfer takes place from the donor to the acceptor, and where a photon is subsequently emitted by the acceptor. Operating at a high FRET efficiency, most energy from the donor is transferred to the acceptor. In the system with the plasmonic array, more donor emission occurs and the photons emitted at the donor wavelength are emitted by the coupled system comprising the donor and the antenna array. Herein, the term "donor luminescent material" or "donor" are applied. Further, herein the terms "acceptor luminescent material" or "acceptor" are applied. The donor and acceptor are luminescent materials, but when configured together, they may form a donor-acceptor luminescent material, leading to a reduction of the donor emission in favor of the acceptor emission (due to (Förster resonance) energy transfer from the donor to the acceptor). Hence, the donor is herein also described as "able to convert at least part of the first light source light into donor light". Instead of the term "donor light" also "donor emission" nay be applied. Likewise, instead of the term "acceptor light" also "acceptor emission" nay be applied. Energy is provided to the donor from an external energy source to cause the donor to reach an excited state, which is discussed in detail below.

A substantial part of energy absorbed by the donor can be transferred to the acceptor and consequently, the emission spectrum of the donor-acceptor system is determined by the acceptor. The extinction coefficient is increased largely due to the increase in the number of absorbers. The quantum efficiency of this combined system is still high since the efficiency of the non-radiative energy transfer process is very high and no concentration quenching of the donor and acceptor is induced. The non-radiative energy transfer process is known as Forster resonance energy transfer (FRET), which is a mechanism describing energy transfer between a donor and an acceptor. FRET is based on transfer of energy via non-radiative dipole-dipole coupling and the efficiency of the transfer is inversely proportional to the distance between the donor and the acceptor. In the absence of the plasmonic antenna array and at high FRET efficiencies, the donor will substantially not emit donor emission (though the donor itself is in principle able to convert at least part of the first light source light into donor light (i.e. donor emission)).

A donor/acceptor should in the present context be understood as any atom, ion, molecule, particle or structure which is capable of being elevated in energy to an excited state through addition of energy, and where relaxation into a state of lower energy may take place through the emission of a photon. The donor and acceptor may also be referred to as photon emitters, or more generally as emitters. Accordingly, although the donor night be capable of emitting a photon, the donor instead transfers part of its energy to the acceptor which in turn emits a photon, by means of the donor/acceptor arrangement.

According to one embodiment of the invention, the acceptor nay advantageously have a first energy level corresponding to said second wavelength and a second energy level higher than the first energy level, and the donor may have an energy level matching the second energy level of the acceptor. That the energy level of the donor is matching the energy level of the acceptor in general means that they are substantially the same. However, the energy levels may also be matching if there is a broad resonance of the donor level which overlaps the second energy level of the acceptor such that non-radiative energy transfer can occur. The energy levels are herein defined with respect to a common reference level Eo, and these are as such relative levels. Therefore, it can be understood that it is not the absolute energy levels of the material that are matched but the energy differences in the first and second energy level with respect to the "ground state" of either the donor or acceptor. The respective first and second energy level should thus be understood as the respective energy difference compared to the reference energy level Eo.

The donor is configured to reach an excited state when absorbing energy corresponding to the energy level in the donor. In a semiconductor, the energy level typically corresponds to the band gap, and the energy required to excite an electron from the valence band to the conduction band is at least equal to the band gap. In an embodiment, the acceptor has a first energy level corresponding to the wavelength of light to be emitted by the lighting device, and a second energy level, above the first energy level, i.e. above the conduction band for a semiconductor acceptor. Thereby, non-radiative energy transfer can occur between the excited donor, having an energy corresponding to the band gap of the donor, and the second energy level of the acceptor. After the energy transfer has taken place, the excited acceptor may relax down to the first energy level before radiative recombination occurs from the conduction band to the valence band, such that a photon is emitted. The same reasoning applies if the donor and acceptor are organic semiconductors, where the valence band is referred to as highest occupied molecular orbital (HOMO) and the conduction band corresponds to the lowest unoccupied molecular orbital (LUMO), and the band gap as the HOMO-LUMO gap. In principle, for FRET to take place the emission spectrum of the donor must overlap the absorption spectrum of the acceptor.

Figure 1A:
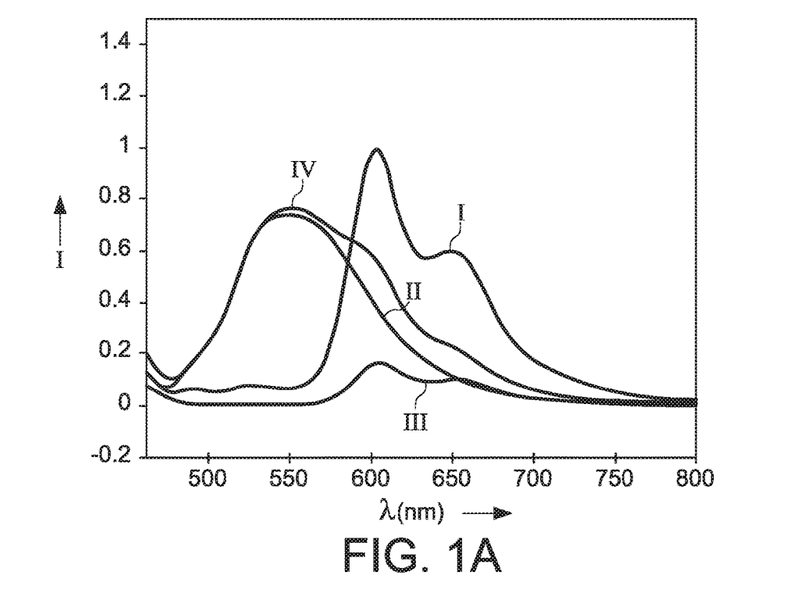
FIG. 1A shows emission spectra of pure donor (II), pure acceptor (III), mixed donor+acceptor (I) as well as the sun of the pure donor and pure acceptor spectra (IV)

Via FRET a first phosphor (donor) is used to enhance the excitation of a second phosphor (acceptor). The emission spectra of a layer made only of the donor, only of the acceptor as well as the mix of both are shown in FIG. 1A (see also below). As can be seen an acceptor enhancement of a factor of approximately five is observed, depending on the FRET efficiency and donor to acceptor ratio. In order to achieve a high acceptor-phosphor enhancement, the system is tuned to exhibit a high FRET efficiency which means in turn that the donor-phosphor emission is completely quenched, as can be seen for the mixed layer spectrum in FIG. 1A in the donor emission range from 500 nm to 550 nm compared to the sum of the pure donor and acceptor emission spectrum. At a high FRET efficiency, variations in acceptor concentration do not impact the FRET efficiency and hence the spectral distribution a lot. The term "phosphor" and "luminescent material" may equally be used and refer to light emitting materials.

As mentioned above, for this purpose a FRET efficiency of the order of at least 70%, even more especially at least 80%, ideally higher, should be used. The FRET efficiency $E_{FRET}$ is defined in equation (1) via the FRET rate $k_{FRET}$ and other donor decay rates (summarized as $k_D = \tau_D^{-1}$)

$$E_{FRET} = \frac{k_{FRET}}{k_{FRET} + k_D} \quad (1)$$

To really calculate the FRET rate in a 3D layer with randomly mixed donors and acceptors, equation (2a)—as found in common literature on FRET—can be used together with (2b) translating Förster radius $R_0$ into a characteristic concentration $c_0$. $\gamma$ $$\gamma\left(\frac{1}{2}\right)$$

represents the complete gamma function.

$$E_{FRET} = 1 - 2 \cdot \int_0^\infty \exp\left[-x^2 - \gamma\left(\frac{1}{2}\right) \cdot x \cdot \frac{c_{Acc}}{c_0}\right] \cdot x dx \quad (2a)$$

$$c_0 = \left(\frac{4}{3} \cdot \pi \cdot R_0^3\right)^{-1} \quad (2b)$$

Figure 4:
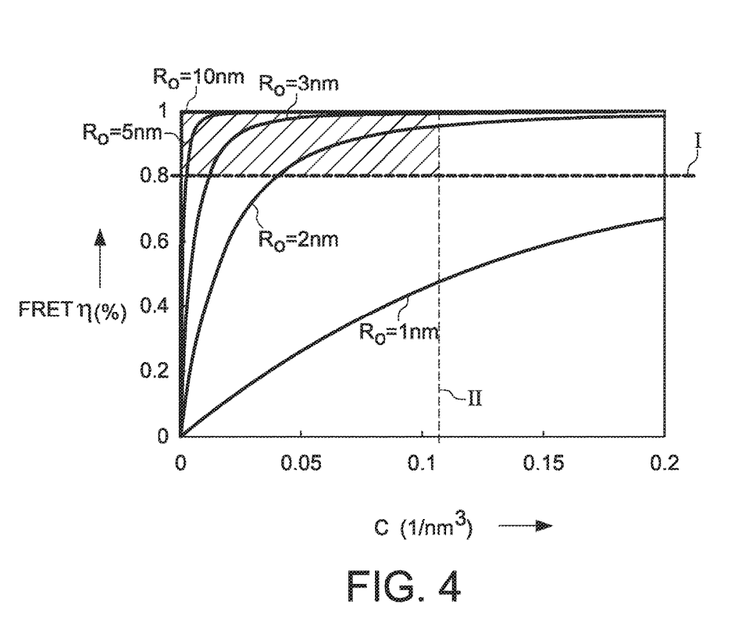
FIG. 4: FRET efficiency as a function of acceptor concentration for a series of different Ro values.

The calculated results of $E_{FRET}$ as a function of $c_{Acc}$ for several $R_0$, which are typically in the range of 0.1 to 10 nm, is shown in FIG. 4. As can be seen the FRET efficiency increases with increasing acceptor concentration, but this depends strongly on the Forster radius. The lower $R_0$ the higher the acceptor concentration has to be to reach a certain FRET efficiency. The above discussed lower limit in FRET efficiency is indicated by the black dashed line. From the preferred material in use, a Forster radius can be calculated and a minimum necessary concentration can be determined—which corresponds to a maximum size of emitter, e.g. molecule or quantum dot (QD), that can be used. The other way around, from the emitter size available, a maximum possible concentration can be determined (indicated by the grey dotted line), which then delimits a region of interest (hatched area) and gives a minimum of $R_0$ that can/should be used. Hence limiting the choice of donor/acceptor combinations.

The light converter is (thus) configured to convert at least part of the light source light into light converter light which comprises the donor emission, acceptor emission, and optionally also light source light.

Hence, the donor and acceptor may be comprised by a single layer. However, the donor and acceptor may also be available in different layers, optionally separated by another (dielectric layer). Further, as will be indicated below, the plasmonic antenna array may be comprised by one of these layers or may be in a separate layer. The combination of donor, acceptor, and plasmonic antenna array are especially comprised by a single body ("converter body"). Hence, they may be comprised by e.g. a transmissive material, such as a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), including in an embodiment (PETG) (glycol modified polyethylene terephthalate). PDMS (polydimethylsiloxane), and COC (cyclo olefin copolymer). Especially, the transmissive material may comprise an aromatic polyester, or a copolymer thereof such as e.g. polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN); especially, the matrix may comprise polyethylene terephthalate (PET). Hence, the transmissive material is especially a polymeric matrix. Glass(es) or transparent ceramics (sapphire, polycristalline alumina) are good support materials due to their higher heat conductivity). Hence, especially such materials may be used as transmissive materials.

According to one embodiment of the invention, the donor and/or the acceptor may advantageously be a perylene dye molecule. Perylene based dye molecules are known in the field of wavelength conversion for light emitting diodes, and it has been found that a combination of two different perylene based dye molecules provide a high FRET efficiency and a high extinction coefficient. Other types of emitters may also be used such as emitters based on CdSe, ZnSe, InP, InGaN QDs, and the like.

Hence, in embodiments said donor luminescent material and said acceptor luminescent material are independently selected from the group comprising rare earth ions, dye molecules and quantum dots. The term "independently selected" indicates that the person skilled in the art may choose different types or same types of luminescent material for the donor and acceptor. The term "independently selected" does not exclude the choice of luminescent materials that are especially able to show energy transfer and/or have spectral properties of special interest, such as for providing the desired color of the lighting device light and/or the desired color temperature of the lighting device light. In specific embodiments, said donor luminescent material and said acceptor luminescent material comprise dye molecules. Suitable examples include e.g. Lumogen F083 as donor and Lumogen F305 as acceptor. In yet further embodiments, said donor luminescent material comprises quantum dots and wherein said acceptor luminescent material comprises dye molecules.

The term "donor" nay in embodiments also refer to a plurality of different donors (i.e. different type of donor molecules). The term "acceptor" may in embodiments also refer to a plurality of different acceptors (i.e. different type of acceptor molecules). In embodiments, the donor an acceptor are different molecules or particles or contained in different crystalline material Especially, in embodiments the donor and acceptor may not be covalently or ionically bound to each other or be part of the same covalently bound or ionically bound molecule or salt. However, in specific embodiments the donor and acceptor may be part of the same molecule, such as e.g. described in unpublished WO2016026863, which is herein incorporated by reference.

Below, some specific embodiments are described, especially in relation to organic dyes as donor and acceptor.

In embodiments, the donor concentration and acceptor concentration are advantageously selected such that the non-radiative transfer of excitation energy from the donor to the acceptor has an efficiency higher than 0.9 (90%). It is desirable that as much as possible of the light emitted from the lighting device has a wavelength corresponding to the wavelength of photons emitted by the acceptor. Thus, a high efficiency of non-radiative energy transfer means that radiative recombination from the donor is suppressed. In general, the efficiency of non-radiative transfer depends on the average distance between donors and acceptors, which in turn is a function of the donor and acceptor concentration in the wavelength converting layer for a given donor/acceptor combination. In the case of an efficiency higher than 0.9, and in an embodiment higher than 0.95 (95%), very little or no donor emission will be detectable and the shape of the emission spectrum will completely resemble that of the acceptor.

The optimum donor/acceptor ratio is determined in part by the acceptor concentration which should especially not be too high as quenching of the acceptor quantum efficiency can reduce the overall system efficiency when the acceptors are too close to each other. Increasing the donor concentration in relation to the acceptor concentration enhances the absorption in the wavelength converting layer. However, the maximum donor/acceptor ratio can be limited as it may be detrimental if donors start to be too close to each other. To determine an optimum ratio, the lifetime of the acceptor excited state and the time for non-radiative transfer may especially also be taken into consideration. In general when a donor is excited and ready to transfer energy, there must be an available acceptor in the ground state ready to receive the energy.

In one embodiment of the invention, the donor and acceptor may advantageously be point emitters selected from the group comprising rare earth ions, dye molecules and quantum dots. In principle any point emitter where excitation may result in the emission of a photon may be used in the present context, and the point emitter may be selected based on the desirable wavelengths and material properties of the application at hand.

In embodiments, the donor may advantageously be a dye molecule or quantum dot emitting green/yellow light having wavelengths from 500 to 580 nm. Moreover, the acceptor may advantageously be a dye molecule or quantum dot emitting red light having wavelengths from 580 to 630 nm. A high extinction coefficient can be achieved by combining two highly efficiently coupled dyes based on FRET. The two dyes are—in embodiments—a green dye that absorbs blue light and emits green light and a red dye that absorbs blue and green light and emits red light. Due to the overlap of the emmission spectrum of the green dye and the absorption spectrum of the red dye, a strong FRET can occur from the green dye molecules to the red dye molecules as they are mixed in the same wavelength converting layer. The majority of energy absorbed by the green dye molecules can be transferred to the red dye molecules and consequently, the emission spectrum of the combined system of the two dyes is determined by the red dye. The extinction coefficient is largely increased due to the increase in the number of absorbers. The quantum efficiency of this combined system is still high (close to 1) since the FRET efficiency is very high and no quenching of the green and red dye is induced.

In embodiments, the donor and acceptor concentration are advantageously selected such that the resulting extinction coefficient and quantum efficiency of the wavelength converting layer comprising the plasmonic antenna array is higher than for a wavelength converting layer comprising only one of the donor and the acceptor and a similar overall extinction. The extinction coefficient and the quantum efficiency of a wavelength converting layer coupled to a plasmonic antenna array are especially determined by the concentration of the wavelength converting particles. However, in some systems the quantum efficiency decreases as the extinction coefficient increases as a result of quenching due to the increasing concentration of wavelength converting particles. It is thus desirable to achieve the advantageous effects of the coupled donor-acceptor system without introducing drawbacks related to a too high concentration of wavelength converting particles.

In embodiments, the lighting device may further comprise an energy source configured to provide energy to the donor such that the donor reaches the excited state. The energy provided to the donor must be equal to or higher than the energy level of the donor, typically corresponding to the band gap or the HOMO-LUMO gap. The donor may also comprise additional energy levels higher than the first energy level such that the donor nay more easily absorb energies larger than the band gap. In principle, any external energy source may be used to excite the point emitter, such as a photon or electron having sufficiently high energy, i.e. higher than the first energy level, x-ray or gamma radiation, heat, injection of electron-hole pairs etc. Moreover, the energy source may for example be a photon emitter, an electron emitter, an x-ray emitter, a gamma-ray emitter or an electron-hole pair. Electrons may for example be emitted by a cathode ray tube (CRT), x-ray s/gamma-rays may for example be provided from a vacuum tube, gamma ray (CT). Especially, the energy source comprises a solid state light source, such as a LED. In an embodiment of the invention the photon emitter may advantageously be a light emitting diode or a solid state laser. Semiconductor based photon emitters are commonly used and may be easily integrated with the abovementioned lighting device.

As indicated above, in specific embodiments the light source comprises a solid state light source (especially for UV and/or blue radiation, especially blue radiation), said donor luminescent material is configured to provide said donor light having a wavelength selected from the range of 500-580 nm, and said acceptor luminescent material is configured to provide said acceptor light having a wavelength selected from the range of 580-650 nm Especially, in embodiments the donor and acceptor luminescent materials may have dominant wavelengths (of their emissions) differing in the range of 20-300 nm such as 30-300 nm, such as especially differing 50-200 nm.

The field of plasmonics refers to the interaction of small conducting structures, typically metal structures, with light, whereby the sine of the metal structures is similar to the wavelength of the light. The conduction electrons in the metal respond to an external electric field and the electron cloud oscillates at the driving optical frequency, leaving behind a more positive charged area, which pulls back the electrons. Due the small size of the metal structures, the resonances can reach the frequencies of visible light. As a result, a metal structure can have a large scatter cross-section which allows a strong interaction with any light that is incident on the metal particles or with any light that is generated in close proximity to the metal particles. Hence, in embodiments the periodic plasmonic antenna array comprises metal nanoparticles.

It has been found that regular arrays exhibit strong enhancement in directionality of the emission which is attributed to hybrid coupled Localized Surface Plasmon Resonance (LSPR) and photonic modes, also referred to as hybrid lattice plasmonic photonic modes, or plasmonic-photonic lattice resonances. The directionality enhancement of the emission is herein referred to as anisotropic emission, i.e. non-Lambertian emission. Ordered arrays of optical antennas support collective resonances. When the wavelength of the radiation is in the order of the periodicity of the array, a diffracted order can radiate in the plane of the array. In this way the localized surface plasmon polaritons sustained by the individual particles may couple via diffraction leading to collective, lattice-induced, hybrid photonic-plasmonic resonances known as surface lattice resonances (SLRs). These delocalized modes extend over several unit cells, making it possible to obtain a collective enhancement of the emission from emitters distributed over large volumes as it is required in solid-state lighting.

Here, use is made of periodic arrays of (metallic) nanoparticles and/or metallic structures that behave as collective nano-antennas. These arrays sustain collective plasmonic resonances. On the one hand, metallic nanoparticles have large scattering cross sections that allow resonant excitation of phosphors in the wavelength converting material thereby enhancing the conversion of light. On the other hand, collective plasmonic resonances enable shaping the angular pattern of the emission, beaming most of the light into a very narrow angular range in a defined direction at a certain wavelength range and/or can be tuned such that most of the light is emitted under angles larger than the total reflection angle in the material, facilitating high efficiency coupling of the generated light into light guides. Therefore, the directional enhancement is explained as the combination of an increased efficiency in the excitation of the wavelength converting medium and an enhancement of the out-coupling efficiency of the emission of the phosphors to extended plasmonic-photonic modes in the array and the subsequent out-coupling to free-space radiation.

The periodic plasmonic antenna array may, for example, be formed on a substrate, after which it may or may not be arranged on the substrate in a final device. The wavelength converting layer comprising the antenna array may, for example, be provided on its own, or it may be arranged on a suitable energy source. A more detailed description of the function and configuration of the plasmonic antenna array can be found in WO2012/098487, unpublished European patent application EP13179374, WO2015019229 and WO2015180976, which are herein incorporated by reference.

According to embodiments of the invention, the plasmonic antenna array may advantageously be configured to comprise plasmon resonance modes being out-of plane asymmetric. By configuring the plasmonic antenna array to provide an asymmetric emission of light, more of the light emitted by the antenna array can be emitted towards the emitting surface of the lighting device. This leads to an increased overall efficiency of the lighting device since a larger portion of the generated light is emitted from the selected light emitting surface of the device. The lighting device can be configured so that light is primarily emitted either through the substrate or from the wavelength converting layer away from the substrate. Out-of plane asymmetric plasmon resonance modes may for example be achieved by making the antenna elements asymmetric, for example having the shape of a pyramid, a truncated pyramid, a cone or a truncated cone. Thereby, the resulting resonant modes for each antenna element become asymmetric which in turn leads to asymmetric light emission properties. The asymmetric shape of the antenna element refers to the asymmetry of a cross section of such an element in a plane parallel to the longitudinal axis of the antenna element, i.e. cross section in a vertical plane of a "standing" antenna element.

The tapering of the antenna element may be important for the asymmetry of the emission. In particular, the asymmetry is based on the simultaneous excitation of electric and magnetic resonances in the antenna elements. As will be further explained below, it is mainly the magnetic and magneto-electric (cross-coupled) response which is enhanced by the broken symmetry. The magnetic response is the response of the antenna element to the magnetic field of the incident light, whereas magneto-electric refers to the excitation of electric fields by incident magnetic fields, and vice versa. It is known from electrodynamics that a single electric dipole coupled to a single magnetic dipole can tailor the forward/backward scattering ratio depending on the relative phase of the dipoles. Typically, most materials do not have a magnetic response at optical frequencies, so the effect is hardly found for light. However, metallic nanostructures can be designed to sustain magnetic excitations of strength comparable to their electric ones. Moreover, these two different excitations may cross-couple, leading to a magneto-electric response.

Increasing the tapering of the antenna elements, where tapering refers to the ratio of the diameter or side at the base to the diameter or side at the top, increases both the magnetic and the magneto-electric response. Thus, by increasing the tapering, the two responses are increased and an antenna array exhibiting an increased asymmetry can be designed. It is also noted that the asymmetry of emission from these structures relies on these having electric and magnetic excitations of similar amplitudes.

According to one embodiment of the invention, the antenna array may advantageously comprise a plurality of truncated pyramidal antenna elements having a top side in the range of 50 to 150 nm a bottom side in the range of 100 to 200 nm, and a height in the range of 100 to 200 nm. Especially, the antenna elements are arranged in a square array (or hexagonal array) having a lattice constant of about 200-1000 nm such as e.g. about 400 nm. The sides are referred to as the sides of a rectangle or square or triangle. In general, with reference to the aforementioned size ranges, arrays based on smaller antenna elements are resonant towards the blue end of the visible spectrum in comparison to larger antenna elements which are resonant towards the red end of the visible spectrum. The total size of the antenna element is of importance for the localized plasmon resonance. The base and top support localized modes, where a difference in size of top and bottom broaden the combined local resonance of the antenna. There are different resonances for top and bottom of a truncated antenna element, and the top and bottom resonances can couple to each other. Then, the height of the antenna element will introduce a phase delay and govern the coupling of the resonances, thereby determining the asymmetry of the emission, partly due to retardation partly due to electro and magnetic resonances. In specific embodiments, the periodic plasmonic antenna array comprises truncated aluminum pyramids having a top side in the range of 50 to 150 nm a bottom side in the range of 100 to 200 nm, and a height in the range of 100 to 200 nm.

Further, in specific embodiments the periodic plasmonic antenna array has a periodicity (herein also indicated as first periodicity or lattice constant, (and herein also indicated with reference p1)) having selected from the range of 200-1000 nm. With such periodicity, coupling with the donor luminescence may be most efficient. Yet, in further specific embodiments the periodic plasmonic antenna array comprises a hexagonal or square array (of (truncated pyramidal) antenna elements).

Hence, the invention provides a lighting device comprising a wavelength converting layer comprising a photon emitting donor configured to absorb energy to reach an excited state, which can emit a photon at a first wavelength, and a photon emitting acceptor; an energy source configured to provide energy to the donor such that the donor reaches the excited state, wherein the donor and the acceptor are selected and arranged at a distance from each other such that non-radiative transfer of excitation energy from the donor to the acceptor occurs, and wherein the acceptor is configured to emit a photon at a second wavelength after the transfer of energy; the lighting device further comprising a periodic plasmonic antenna array, embedded within the wavelength converting layer, and comprising a plurality of individual antenna elements arranged in an antenna array plane, the plasmonic antenna array being configured to support a first lattice resonance at the first wavelength, arising from coupling of localized surface plasmon resonances in the individual antenna elements to photonic modes supported by the system comprising the plasmonic antenna array and the wavelength converting layer, wherein—in embodiments—the plasmonic antenna array is configured to comprise plasmon resonance modes such that light emitted from the plasmonic antenna array has an anisotropic angle distribution.

As presented in the previous section, the FRET efficiency, together with the acceptor enhancement, and the plasmonic efficiency, related to the photoluminescence enhancement of the donor by the plasmonic array, are competing Therefore it is necessary to tune the FRET rate (determining the FRET efficiency) and/or the plasmonic rate/efficiency in such a way that both the enhancement of the acceptor as well as the donor can be achieved.

From the experimental results shown as amongst others described herein, it can be seen that to achieve a relevant level of donor emission enhancement, e.g. photoluminescence efficiency enhancement (PLE)>5 as in the case of a medium acceptor concentration, the plasmonic rate has to be at least 10% of the FRET rate, otherwise the FRET process will be too fast and immediately quench all the donor emission. From this limit together with some application specifications, requirements for the FRET system and the plasmonic system can be deducted. To our knowledge, not much is known about design rules for plasmonic structures to tune the impact of the plasmonic array on the donor decay dynamics. There is however knowledge on how to tune the resonance wavelength. So, taking this as a starting point, the plasmonic rate for a particular structure and a set of suitable donors emitting in the desired wavelength range can be determined. In our case the plasmonic rate was determined to be of the order of 0.04 l/ns. The FRET rate depends strongly on the donor and acceptor properties in use as well as the donor-acceptor separation d, which can be tuned via the acceptor concentration $c_{Acc}$ in case of multiple acceptors. Equation (3) shows the relation of FRET rate and donor/acceptor properties for a single donor-acceptor pair and equation (4) gives the relation for a pure donor and a pure acceptor layer with the separation d. Most importantly the donor properties are reflected by its "natural" decay time $\tau_D$ (in absence of acceptors, plasmonic/photonic structures that can impact the decay dynamics) and the characteristic FRET distance: the Forster radius $R_0$, which is describing the donor and acceptor interaction strength determined from the donor emission and acceptor absorption spectrum Hence the FRET rate can be tuned either by selecting different donors and acceptors (influencing $\tau_D$ and $R_0$) or by changing d or $c_{Acc}$.

$$k_{FRET} = \tau_D^{-1} \cdot \left(\frac{R_0}{d}\right)^6 \quad (3)$$

$$k_{FRET} = \frac{c_{Acc} \cdot \pi \cdot R_0^6}{2 \cdot d^4 \cdot \tau_D} \quad (4)$$

Therefore, when the plasmonic rate is known a donor-acceptor system with an appropriate FRET rate and efficiency can be designed—mostly by selecting an appropriate acceptor and acceptor concentration. Alternatively, once the design rules for plasmonic arrays are better understood, the selection can also occur the other way round by tuning the plasmonic structure to have an appropriate resonance wavelength and plasmonic rate for a pre-selected donor-acceptor pair.

The FRET decay rate $\tau_{FRET}^{-1}$ of a sample consisting of a mixture of a donor and an acceptor material can e.g. be determined by measuring the decay rate $\tau_{DA}^{-1}$ of that sample, as well as the decay rate $\tau_D^{-1}$ of a sample (with the same thickness on the same substrate) consisting of only the donor material. The FRET decay rate is found as $\tau_{FRET}^{-1} = \tau_{DA}^{-1} - \tau_D^{-1}$. The plasmonic decay rate $\tau_{plas}^{-1}$ of a sample consisting of a layer of luminescent material on a plasmonic array on a substrate can e.g. be determined by measuring the decay rate $\tau_{with}^{-1}$ of that sample, as well as the decay rate $\tau_{without}^{-1}$ of a sample consisting of a layer of the same luminescent material with the same thickness on the same substrate but without the plasmonic array. The plasmonic decay rate is found as $\tau_{plas}^{-1} = \tau_{with}^{-1} - \tau_{without}^{-1}$.

Nanostructures can influence the decay rate of a luminescent material. In particular, structures supporting localized surface plasmon resonances, like nanoparticle structures, can do so. In the case of isolated metal nanoparticles, the plasmon resonances provide high local fields close to the particles. These local resonances can be coupled to extended modes by structuring the surface of a substrate with a periodic array of such particles, a so-called plasmonic array. These extended modes can be diffracted waves propagating along the surface, the so-called Rayleigh anomalies, or waveguide modes in case there is a thin waveguiding layer on top of the substrate. If the thin layer contains the luminescent material, its emission characteristics will depend on the details of the structure and can be tailored by designing it adequately. A parameter in this design is the thickness of the layer, which will influence the confinement of waveguide modes. This confinement affects the strength with which the surface plasmon resonances couple to the more delocalized waveguide modes and hence the decay rate. The shape and dimensions (height, width, length) of the (metallic) particles, and the material of the (metallic) particles, can influence the decay rate to some extent, whereas the coupling also depends on the array period and symmetry.

Therefore, in specific embodiments the donor-acceptor luminescent materials have a donor-acceptor energy transfer efficiency of at least 70%, the donor-acceptor luminescent materials have a donor-acceptor energy transfer rate ($k_{FRET}$), and the periodic plasmonic antenna array has a plasmonic rate ($k_P$) which is at least 5%, such as especially at least about 10%, like at least about 20% of the donor-acceptor energy transfer rate ($k_{FRET}$). At maximum, the plasmonic rate may be in the range of about 300% of the donor-acceptor energy transfer rate, like at maximum about 250%, such as up to about 100%.

The donor, acceptor, and plasmonic antenna array may be comprised by a single layer or many distributed over more than one layer in a layer structure, optionally with intermediate layers in between. Best results may however be obtained when the distance between the donor and acceptor is equal to or less than about 25 nm, especially equal to or less than about 15 nm, such as in the range of 0.5-10 nm. The distance between the donor molecules and the plasmonic antenna array is especially in the range of about 10-3000 nm, especially about 10-2000 nm, such as in the range of about 100-1000 nm, such as in the range of 100-800 nm, such as especially in the range of about 200-700 nm. In embodiments, the donor luminescent material, acceptor luminescent material, and the periodic plasmonic antenna array are comprised by a single layer. However, in other embodiments the donor luminescent material acceptor luminescent material, and the periodic plasmonic antenna array are comprised by different layers not comprising the one or more of the other of the donor luminescent material, acceptor luminescent material, and the periodic plasmonic antenna array.

As indicated above, the periodic plasmonic antenna array couples with the donor luminescence. In yet further embodiments, optionally a further periodic plasmonic antenna array may be provided which may couple with the acceptor luminescence. This may increase the efficiency and/or assist in controlling the angular distribution of the acceptor luminescence, e.g. substantially identical to the angular distribution of the donor luminescence. Therefore, in embodiments the light converter comprises a second periodic plasmonic antenna array configured to enhance generation of said acceptor light (and/or configured to control directionality of said acceptor light), wherein the second periodic plasmonic antenna array has a second periodicity (also indicated with reference p2) different from the periodicity of the periodic plasmonic antenna array. The periodic plasmonic antenna array nay be spatially separated in e.g. one or more regions with a first periodic plasmonic antenna array and one or more regions with a second periodic plasmonic antenna array. However, optionally the first and second periodic plasmonic antenna arrays may be comprised by a larger array that comprises both periodicities. Values for the first periodicity and the second periodicity may especially be different but values for second periodicity any be in the same ranges as indicated for first periodicity.

The lighting device may be part of or may be applied in e.g. office lighting systems, household application systems, shop lighting systems, home lighting systems, accent lighting systems, spot lighting system, theater lighting system, fiber-optics application system, projection systems, self-lit display systems, pixelated display systems, segmented display systems, warning sign systems, medical lighting application system, indicator sign systems, decorative lighting systems, portable systems, automotive applications, (outdoor) road lighting systems, urban lighting systems, green house lighting systems, horticulture lighting or LCD backlighting.

In a specific embodiment, the light source comprises a solid state light source (such as a LED or laser diode).

The term "light source" many also relate to a plurality of light sources, such as 2-200 (solid state) LED light sources. Hence, the term LED may also refer to a plurality of LEDs.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1B:
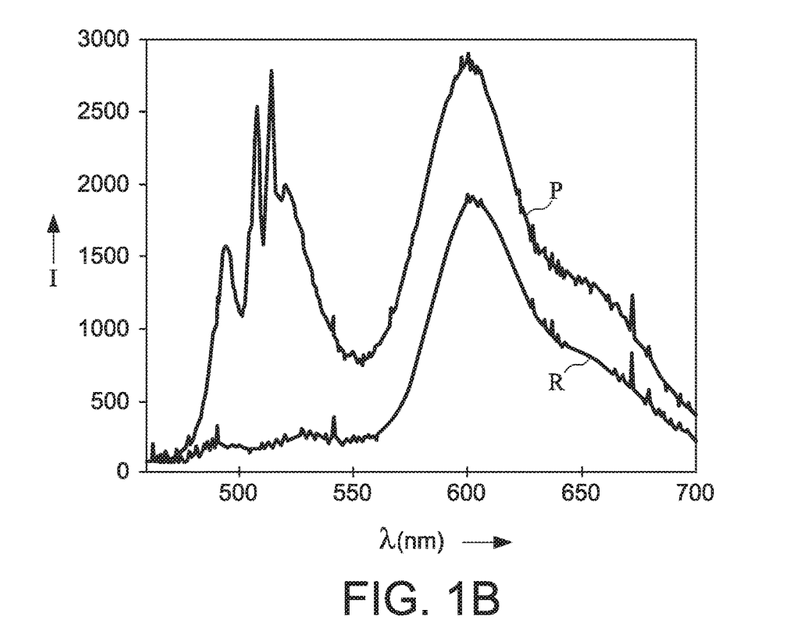
FIG. 1B shows emission spectra of the mix shown in FIG. 1A on glass as reference (R (reference)) and on a square plasmonic array (P (plasmonic sample))

FIGS. 1A and 1B show (a) emission spectra of pure donor (II), pure acceptor (III), mixed donor+acceptor (I) as well as the sum of the pure donor and pure acceptor spectra (IV). The mixed donor+acceptor spectrum is normalized and the other spectra are scaled accordingly (FIG. 1A) and (b) Emission spectra of the mix shown in (a) on glass as reference (R (reference)) and on a square plasmonic array (P (plasmonic sample)). The spectra are recorded at 0° to the angle normal for p-polarization (FIG. 1B). The x-axis displays the wavelength in nm and the y-axis the relative intensity in counts.

Figure 2A:
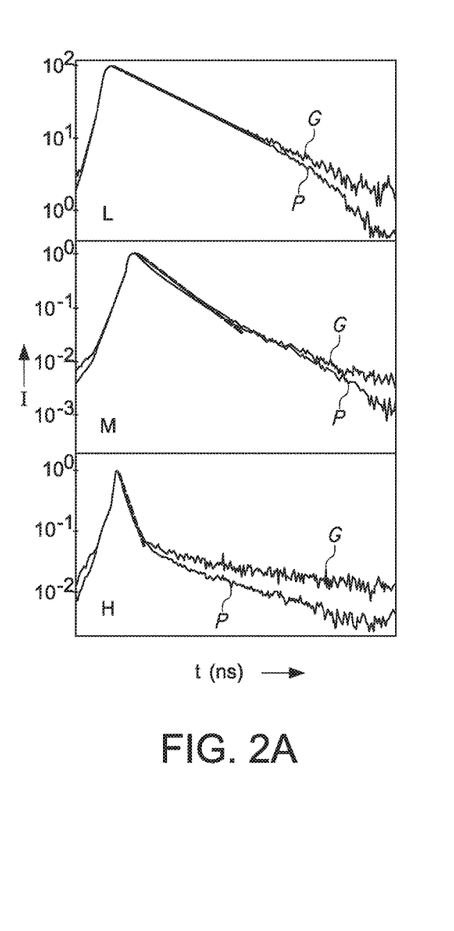
FIG. 2A shows comparison of the time-resolved donor emission decay for donor+acceptor nix on glass (G) and on plasmonics (P)
Figure 2B:
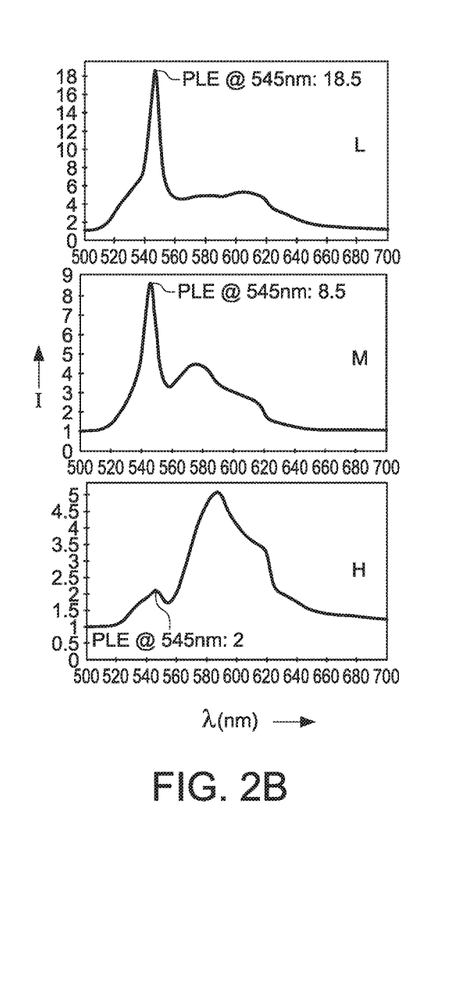
FIG. 2B shows the emission enhancement of the mix on plasmonics with respect to the nix on glass reference.

It was found that a mixed film of donor and acceptor phosphors on top of a square plasmonic nanoparticle array, the FRET rate and efficiency were almost not influenced by the plasmonics. This can be seen in the non-changing short donor decay in the mix on glass-reference as well as on plasmonics at a particular acceptor concentration, highlighted by the red dashed line in each of the three panels in FIG. 2A. From top to bottom, the acceptor concentration of the samples increases from 0.08 to 0.17 and 1% (the concentration is given in weight % in polystyrene on a glass substrate (layer obtained by spin coating)), corresponding to an increased FRET rate and efficiency (see FIG. 3A), as expected, reflected in an increasingly shortened emission decay shown in FIG. 2A. FIG. 2A shows Comparison of the time-resolved donor emission decay for donor+acceptor mix on glass (G) and on plasmonics (P). The panels from top to bottom show samples with increasing acceptor concentration, i.e. increasing FRET rate and efficiency, while the donor concentration remained constant. The x-axis displays the time in nanosecond and the y-axis displays the normalized intensity. L, M and H indicate low, medium and high acceptor concentration, respectively. FIG. 2B shows the emission enhancement of the nix on plasmonics with respect to the nix on glass reference. The x-axis displays the wavelength in nm and the y-axis the emission enhancement (PLE) due to the plasmonics in counts. The reference "L" indicates low acceptor concentration. The reference "M" indicates medium acceptor concentration. The reference 'H' indicates high acceptor concentration. The plasmonic enhancement of the donor emission in the mixed FRET layer, shown in the three panels of FIG. 2B at the same acceptor concentrations as in (a), does change with acceptor concentration. While at low acceptor concentrations, where the FRET efficiency and rate are low, the enhancement at 545 nm reaches 18.5, it decreases to 8.5 and further to only 2 at high acceptor concentrations, where the FRET efficiency is higher. As in (a) the panels from top to bottom represent samples with increasing acceptor concentration. The enhancement spectra were calculated from emission spectra recorded for an emission angle range of 0-14° with respect to the angle normal.

Figure 3A:
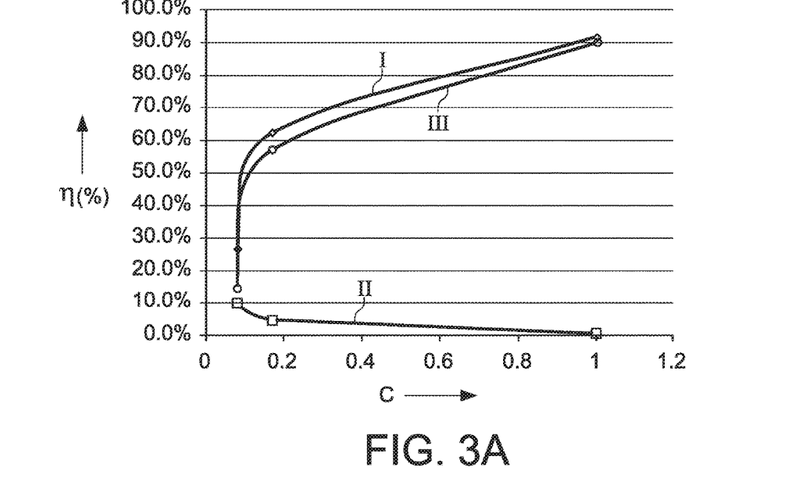
FIG. 3A shows the efficiency of FRET on glass (I), FRET on plasmonics (III) as well as plasmonic efficiency for the donor-acceptor mix (II)
Figure 3B:
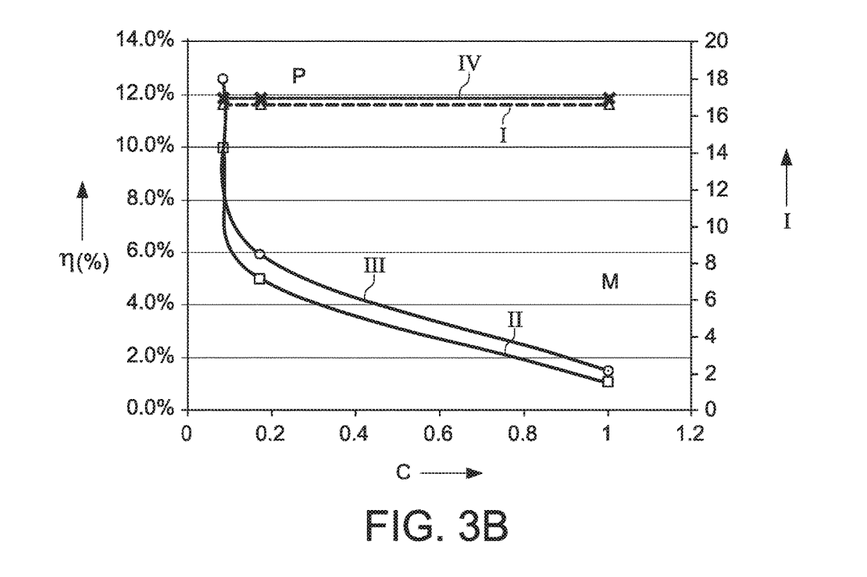
FIG. 3B shows a comparison of the trend with acceptor concentration of the plasmonic efficiency at donor emission wavelengths and donor emission enhancement for pure donor and donor in the mix.

To better understand these observations, next to the FRET efficiency calculated from the increase of the donor emission decay rate in the presence of the acceptor, also a plasmonic efficiency is calculated and shown along with the FRET efficiency on glass and plasmonics in FIG. 3A. The plasmonic efficiency is calculated as the change in rate of the donor on glass and on plasmonics with respect to the overall donor decay rate in the nix on plasmonics. Even though this plasmonic efficiency might neglect certain interactions of the donor with the plasmonic array, e.g. longer range coupling, it gives an indication of how strongly the plasmonic array influences the donor decay dynamics. Therefore this efficiency is used to describe the part of the interaction of donors and the plasmonic array that can influence or compete with the FRET process. As can be seen the plasmonic efficiency decreases with increasing acceptor concentration as the FRET efficiency increases. Furthermore, it can be seen that the FRET efficiency does not show a big difference on glass and plasmonics. FIG. 3A shows the efficiency of FRET on glass (I), FRET on plasmonics (III) as well as plasmonic efficiency for the donor-acceptor mix (II). The x-axis displays the concentration (wt. %) of the acceptor and the y-axis displays the efficiency. FIG. 3B shows a comparison of the trend with acceptor concentration of the plasmonic efficiency at donor emission wavelengths (left-hand axis X) (curves I for pure donor and II for donor in the mix) and donor emission enhancement (right-hand axis)(calculated as the ratio of photoluminescence of plasmonics and on glass at resonant wavelength) for pure donor (dashed line IV) and donor in the mix (solid line III). The curves III and IV (circle and cross) indicate the emission enhancement and the curves II and I (square and open triangle) represent the plasmonic efficiency (donor in mix and pure donor respectively). As can be seen the trend in plasmonic efficiency and the donor emission enhancement with increasing acceptor concentration are very similar for the donor in the nix confirming that the plasmonic efficiency as defined here can be used as an indication of the impact of the plasmonics on the donor emission. As expected, at low acceptor concentration the values approach those of the pure donor case.

The calculated results of $E_{FRET}$ as a function of $c_{Acc}$ for several R0, which are typically in the range of 0.1 to 10 nm are shown in FIG. 4 (see also above). As can be seen the FRET efficiency increases with increasing acceptor concentration, but this depends strongly on the Forster radius. The lower R0 the higher the acceptor concentration has to be to reach a certain FRET efficiency. The above discussed lower limit in FRET efficiency of e.g. especially 80% is indicated by the dashed line I. From the preferred material in use, a Forster radius can be calculated and a minimum necessary concentration can be determined—which corresponds to a maximum sire of emitter, e.g. molecule or QD, that can be used. The other way around, from the emitter size available, a maximum possible concentration can be determined (indicated by the dotted line II), which then delimits a region of interest (indicated in the left upper angle) and gives a minimum of R0 that can/should be used. Hence limiting the choice of donor/acceptor combinations. FIG. 4 thus shows FRET efficiency as a function of acceptor concentration for a series of different R0 values. The dashed line I indicates the lower limit of the FRET efficiency that is interesting for application and the dotted line II indicates a possible concentration limit, depending on the acceptor emitter in use.

As discussed above, the simplest implementation to generate white light is to use a single plasmonic array resonant with the donor emission. Depending on the donor emission wavelength that should be enhanced, the geometry of the plasmonic array and the particle shape can be adjusted. To enhance resonances in e.g. a wavelength range of 500 to 580 nm in directions parallel to the sample normal these could be for example previously proposed arrays of truncated aluminum pyramids arranged in a square pattern with a pitch of ranging from 300 nm to 500 nm or hexagonal pattern with a pitch of 350 to 580 nm.

Figure 5A:
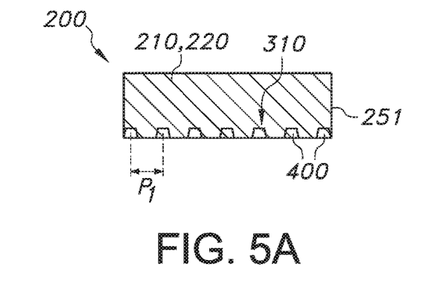
FIGS. 5A through 5D schematically illustrate cross sections of donor-acceptor FRET phosphor layer coupled to a single plasmonic array in resonance with the donor emission only as well as an example of a plasmonic structure.

A mix of donors and acceptor phosphors is deposited on or around the plasmonic array (see FIG. 5A). Furthermore, the donors and acceptors can be pre-arranged and linked in a favorable geometry. In this geometry the donor-acceptor distance as well as the acceptor concentration i.e. the number of acceptors, influences the FRET rate. The number of donors per acceptor along with the probability for FRET. i.e. the FRET efficiency, determines the acceptor enhancement. Rather than just depositing a full, homogeneous layer of mixed donor and acceptor phosphors the donor and acceptor can also be arranged in nixed layers at positions of high plasmonic field enhancement, e.g. a layer at a particular distance to the array, see FIG. 5B, or in a specific pattern that is aligned with respect to the nanoparticle position, see FIG. 5C. Furthermore, the donor and acceptor phosphor layer can also be applied separately in layers at their respective optimum positions with respect to the plasmonic array (see FIG. 5D) while still maintaining FRET interaction. In order to achieve FRET interaction between separated donor and acceptor layers, the layers have to be within the FRET interaction distance of typically a few nanometers (due to the strong distance dependence of the FRET process).

Figure 5B:
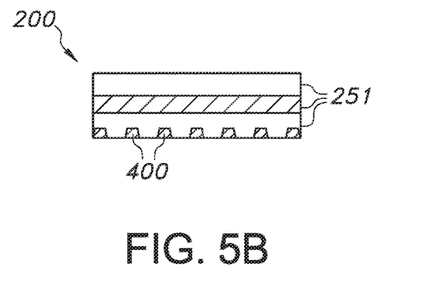
Figure 5C:
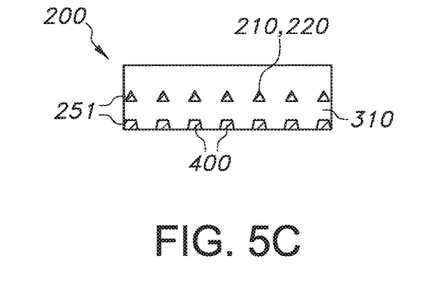
Figure 5D:
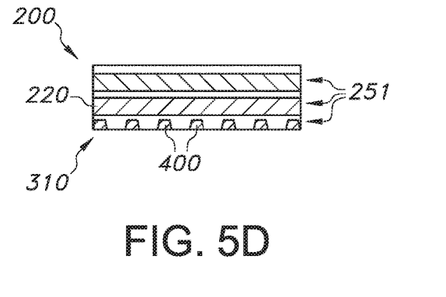
Figure 5E:
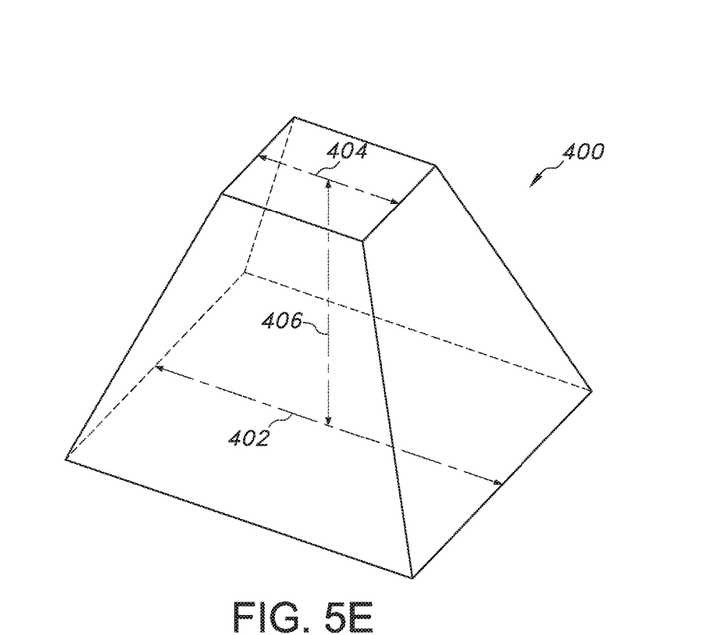
FIG. 5E schematically illustrates an antenna element of an illumination device according to an embodiment of the invention.

Here, embodiments of light converters 200 are schematically displayed, wherein the light converter 200 comprises a donor luminescent material 210 (able to convert at least part of the first light source light into donor light), and an acceptor luminescent material 220, wherein the donor luminescent material 210 and acceptor luminescent material 220 are configured as donor-acceptor luminescent material. The light converter 200 further comprises a periodic plasmonic antenna array 310, such as configured to enhance generation of said donor light. Alternatively or additionally, the periodic plasmonic antenna array 310 may be configured to control directionality of said donor light. Hence, directionality may be enhanced. The antenna array 310 includes elements 400, such as metallic (truncated) pyramids. FIGS. 5A through 5D schematically depict cross sections of donor-acceptor FRET phosphor layer coupled to a single plasmonic array in resonance with the donor emission only (truncated pyramids). (a) Full, mixed phosphor layer on top of plasmonic array (FIG. 5A). (b) Localized, complete mixed phosphor layer at an optimized distance to the plasmonic array (FIG. 5B). (c) Mixed phosphor pattern deposited at optimized positions with respect to the plasmonic array (FIG. 5C). (d) Separated donor (green) and acceptor phosphor layers (red) (possibly patterned) deposited at an optimized distance with respect to the plasmonic array (FIG. 5D). Layers are indicated with reference 251. FIG. 5E schematically illustrates an antenna element of an illumination device according to an embodiment of the invention. In this example embodiment, an antenna element in the form of truncated pyramidal antenna elements 400 I schematically depicted. The antenna element has a top side 404 in the range of 110 to 130 nm, a bottom side 402 in the range of 135 to 155 nm, and a height 406 in the range of 100 to 160 nm. The sides are in this example the lengths of the sides of a square, but rectangles or triangles are also possible. Moreover, the antenna elements can be arranged in a square array having a lattice constant (p1) of e.g. about 400 nm, but other values may also be possible. Also a hexagonal array with a period of 470 nm may exhibit near normal enhanced emission, but other lattice constant values may also be possible.

Figure 6A:
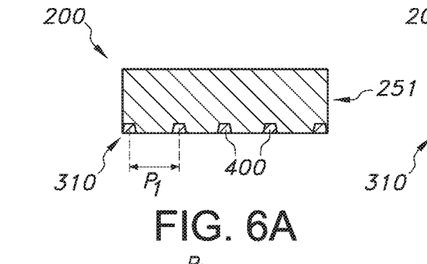
FIG. 6A schematically depicts a cross section of a mixed donor-acceptor phosphor layer on top of a plasmonic array (truncated pyramids) that exhibits resonances in the donor as well as acceptor emission wavelengths.
Figure 6B:
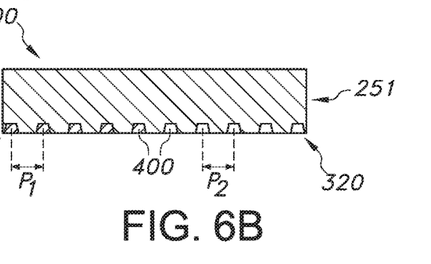
FIG. 6B schematically depicts a cross section of a mixed phosphor layer deposited on a plasmonic array with regions designed to be in resonance with the donor emission (hatched truncated pyramids) and other regions in resonance with the acceptor emission (white truncated pyramids)
Figure 6C:
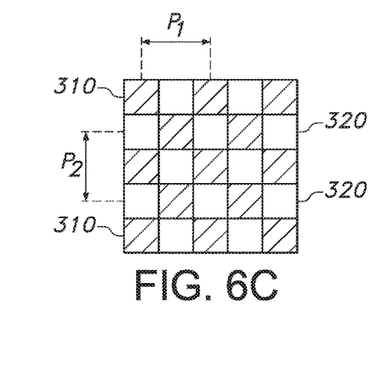
FIG. 6C schematically depicts a top-view of the plasmonic arrays with different regions as in FIG. 6B arranged in a check-board pattern FIG. 6D schematically depicts a cross section of a structure with a nixed phosphor layer and plasmonic arrays in resonance with the donor emission (hatched truncated pyramids) and acceptor emmission (white truncated pyramids) located at different heights in the phosphor layer and extending over the whole area of the sample.
Figure 6D:
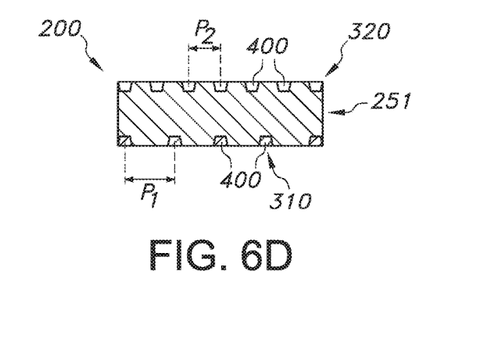

If also the acceptor emission should be angularly and/or spectrally shaped, also plasmonic resonances in the acceptor emission wavelength range have to be present. This can be achieved via a nanoparticle array that has resonances in the donor as well as acceptor wavelength range; a schematic cross section of a possible structure is shown in FIG. 6A. The nanoparticle array has to be carefully designed to show the envisioned resonance wavelengths at the right angles. Alternatively, two separate arrays need to be used to enhance the emission of donor as well as acceptor. These arrays can be applied in a micro-pattern leading to local enhancement of a single phosphor type at a particular position. A cross section of such a patterned array is shown in FIG. 6B and in FIG. 6C the example of a checker-board pattern is given in top view. To achieve the enhancement and shaping effect due to the plasmonics over the full area of the sample, the two arrays can also be applied at different heights within the layer, see FIG. 6D, e.g. on opposite sides. This can be done by either "gluing" two substrates supporting the two different arrays together with the phosphor layer or fabricating a second array on top of the phosphor layer. For all the above given example structures holds that the donor acceptor layer can be homogeneously mixed or separated into donor and acceptor domains and show some spatial structure as discussed above. FIGS. 6A through 6D schematically depict such structures of mixed donor-acceptor FRET phosphor layers coupled to a single or multiple plasmonic arrays in resonance with the donor and acceptor emission. (a) Cross section of a mixed donor-acceptor phosphor layer on top of a plasmonic array (truncated pyramids) that exhibits resonances in the donor as well as acceptor emission wavelengths (FIG. 6A). (b) Cross section of a mixed phosphor layer deposited on a plasmonic array with regions designed to be in resonance with the donor emission (hatched truncated pyramids) and other regions in resonance with the acceptor emission (white truncated pyramids) (FIG. 6B). (c) Top-view of the plasmonic arrays with different regions as in FIG. 6B arranged in a check-board pattern (FIG. 6C). (d) Cross section of a structure with a mixed phosphor layer and plasmonic arrays in resonance with the donor emission (hatched truncated pyramids) and acceptor emission (white truncated pyramids) located at different heights in the phosphor layer and extending over the whole area of the sample (FIG. 6D). Reference p1 indicates the first period or lattice constant, for coupling with the donor and reference p2 indicates the second lattice constant for coupling with the acceptor. FIGS. 6A through 6D schematically depict embodiments wherein the light converter 200 comprises a first periodic plasmonic antenna array 310 configured to enhance generation of said donor light but also a second periodic plasmonic antenna array 320 configured to enhance generation of said acceptor light (and/or configured to control directionality of said acceptor light), wherein the second periodic plasmonic antenna array 320 has a second periodicity p2 different from the first periodicity p1 of the periodic plasmonic antenna array 310. With such second periodic plasmonic antenna array 320, also directionality of acceptor light may be enhanced.

Figure 7:
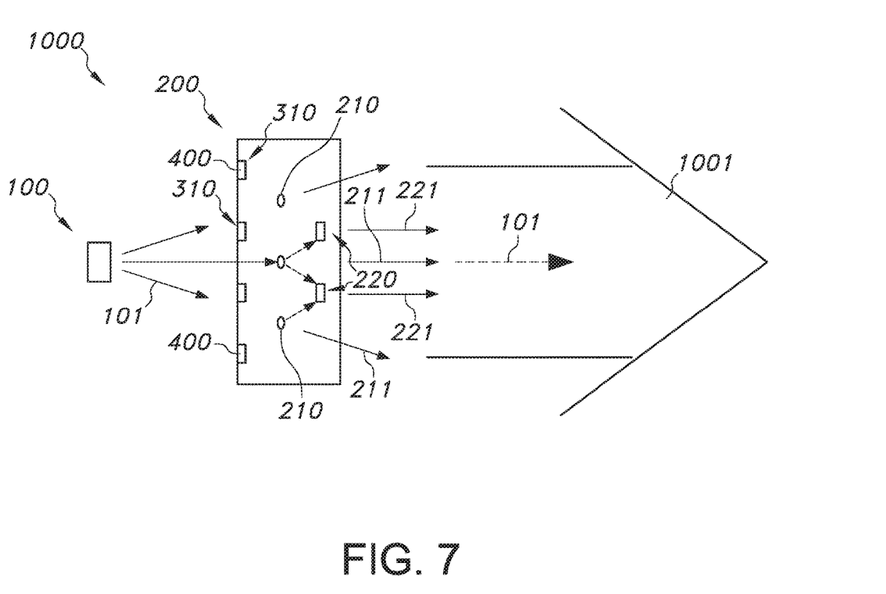
FIG. 7 schematically depicts an embodiment of the lighting device.

FIG. 7 schematically depicts an embodiment of the lighting device 1000, comprising a light source 100 and a light converter 20X). The light source 100, such as a LED, is configured to provide light source light 101. The light converter 200 comprises a donor luminescent material 210 able to convert at least part of the first light source light into donor light 211, and an acceptor luminescent material 220. The donor luminescent material 210 and acceptor luminescent material 220 are configured as donor-acceptor luminescent materials 210,220 which, upon excitation of the donor luminescent material 210 by the light source light 101 provide acceptor light 221 having an acceptor light spectral distribution different from a donor light spectral distribution of the donor light 211. Further, the light converter 200 further comprises a periodic plasmonic antenna array 310 configured to enhance generation of said donor light 211, and wherein the lighting device 100 is configured to provide lighting device light 1001 comprising said donor light 211 and said acceptor light 221.

In an example, two phosphor materials investigated were LUMOGEN F yellow 083 (donor) and LUMOGEN F red 305 (acceptor), which are doped in 600 nm thick polystyrene layers deposited on fused silica substrates by spin-coating. The QY (quantum yield) of the dye layers as a function of concentration is measured in a spectrally calibrated integrating sphere with excitation from a 448 nm laser. The QY of both F 083 and F 305 are high at low concentrations and decrease largely with the increase of the concentration. In order to have a high QY, it is preferable to keep the concentration low (around 1 wt. %), which limits the color conversion of the dye layer. For example, the absorbance of a 600 nm layer with 1 wt % F 305 is less than 10%. However, to generate white light with the same layer thickness, approximately 10 times higher concentration is needed with which the QY drops to below 60%. To achieve a higher color conversion, we mixed F 305 with F 083 in the same ensemble to enhance the excitation of F 305. The emission spectrum of F 083 overlaps with the absorption spectrum of F 305, which enables FRET from the F 083 molecules to the F 305 molecules.

To investigate the contribution of FRET in the change of emission spectrum, we varied the concentration of the two dye molecules and calculate the quenching efficiency of the green emission due to the presence of F 305 molecules. The quenching efficiency follows the trend of the FRET efficiency, indicating that FRET from F 083 to F 305 is the major contribution to the quenching of the green emission.

The small mismatch between the quenching efficiency and the calculated FRET efficiency may originate from the inaccuracy in the determination of the concentration and the extinction coefficient. The measured QY of the sample with a mixture of 1 wt % F 083 and 0.5 wt % F305 is 96±2%, rather high compared to the measured QY of the pure F 305 and F 083 samples. This high QY of the mixture is on the one hand due to a high QY of the pure F305 at a (relatively) low weight concentration of 0.5 wt %, where intrinsic non-radiative decay can be neglected. On the other hand, the intrinsic non-radiative decay of F 083 is very low and the excitation energy is transferred with a high efficiency of about 75% to the F305 dye molecules. By introducing a donor material we largely enhanced the emission of F 305 without sacrificing its high QY.

To enhance the green emission, we make use of the hybrid of plasmonic and photonic resonances called waveguide-plasmon polaritons generated by a square array of Al nanoparticles. The lattice constant is designed to be 330 nm so that the TM- and TE-waveguide modes supported by the dye layer are coupled into the forward emission direction. We fabricate the array on a fused silica substrate using the substrate conformal imprint lithography in combination with reactive ion etching Results are shown in amongst others FIGS. 1A, 1B, 2A, and 2B.

As indicated above, the FRET transfer rate can be calculated from/inferred from time resolved luminescence decay measurements, either directly from the donor emission (in a pure (donor only) and a mixed (donor & acceptor) layer) and sometimes one can also get information from a rise-time that can be seen in the acceptor decay in the nix compared to a pure layer (only comprising the acceptor). From time resolved luminescence decay measurements (analogous to the FRET rate), the plasmonic rate can be determined. Tuning of the plasmonic rate/FRET rate ratio can e.g. be done either by adjusting the FRET rate for a fixed plasmonic rate or the plasmonic rate can be tuned by changing the properties of the plasmonic array.

The term "substantially" herein, such as in "substantially all light" or in "substantially consists", will be understood by the person skilled in the art. The term "substantially" may also include embodiments with "entirely", "completely", "all" etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or" For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising a light source and a light converter, wherein the light source is configured to provide light source light, wherein the light converter comprises a donor luminescent material able to convert at least part of the first light source light into donor light, and a acceptor luminescent material, wherein the donor luminescent material and acceptor luminescent material are configured as donor-acceptor luminescent materials which, upon excitation of the donor luminescent material by the light source light provide acceptor light having an acceptor light spectral distribution different from a donor light spectral distribution of the donor light, wherein the light converter further comprises a periodic plasmonic antenna array configured to enhance generation of said donor light, and wherein the lighting device is configured to provide lighting device light comprising said donor light and said acceptor light.

2. The lighting device according to claim 1, wherein the donor luminescent material, acceptor luminescent material, and the periodic plasmonic antenna array are configured to provide, upon generation of the light source light, said lighting device light comprising said donor light, said acceptor light, and said light source light.

3. The lighting device according to claim 1, wherein the lighting device is configured to generate white lighting device light.

4. The lighting device according to claim 1, wherein said donor luminescent material and said acceptor luminescent material comprise dye molecules.

5. The lighting device according to claim 1, wherein said donor luminescent material comprises quantum dots and wherein said acceptor luminescent material comprises dye molecules.

6. The lighting device according to claim 1, wherein the light source comprises a solid state light source, wherein said donor luminescent material is configured to provide said donor light having a wavelength selected from the range of 500-580 nm, and wherein said acceptor luminescent material is configured to provide said acceptor light having a wavelength selected from the range of 580-650 nm.

7. The lighting device according to claim 1, wherein the donor-acceptor luminescent materials have a donor-acceptor energy transfer efficiency of at least 70%, wherein the donor-acceptor luminescent materials have a donor-acceptor energy transfer rate, wherein the periodic plasmonic antenna array has a plasmonic rate which is at least 10% of the donor-acceptor energy transfer rate.

8. The lighting device according to claim 1, wherein the donor luminescent material, acceptor luminescent material, and the periodic plasmonic antenna array are comprised by a single layer.

9. The lighting device according to claim 1, wherein the donor luminescent material, acceptor luminescent material, and the periodic plasmonic antenna array are comprised by different layers not comprising the one or more of the other of the donor luminescent material, acceptor luminescent material, and the periodic plasmonic antenna array.

10. The lighting device according to claim 1, wherein the periodic plasmonic antenna array has a periodicity having selected from the range of 200-1000 nm.

11. The lighting device according to claim 10, and wherein the plasmonic antenna array comprises a hexagonal or square array.

12. The lighting device according to claim 1, wherein the periodic plasmonic antenna array comprises metal nanoparticles.

13. The lighting device according to claim 1, wherein the periodic plasmonic antenna array comprises truncated aluminum pyramids having a top side in the range of 50 to 150 nm, a bottom side in the range of 100 to 200 nm, and a height in the range of 100 to 200 nm.

14. The lighting device according to claim 1, wherein the light converter comprises a second periodic plasmonic antenna array configured to enhance generation of said acceptor light, wherein the second periodic plasmonic antenna array has a second periodicity different from the periodicity of the periodic plasmonic antenna array.

* * * * *